United States Patent [19]
Matsumoto et al.

[11] Patent Number: 5,654,235
[45] Date of Patent: Aug. 5, 1997

[54] METHOD OF MANUFACTURING CONTACT STRUCTURE USING BARRIER METAL

[75] Inventors: Ryoichi Matsumoto; Yoshiyuki Kawazu, both of Tokyo, Japan

[73] Assignee: OKI Electric Industry Co., Ltd., Tokyo, Japan

[21] Appl. No.: 493,581

[22] Filed: Jun. 22, 1995

[30] Foreign Application Priority Data

Aug. 18, 1994 [JP] Japan ............... 6-194016

[51] Int. Cl.$^6$ .................................. H01L 21/28
[52] U.S. Cl. ............. 438/643; 438/648; 438/658; 438/660
[58] Field of Search ................. 437/190, 192, 437/195, 200

[56] References Cited

U.S. PATENT DOCUMENTS

| | | | |
|---|---|---|---|
| 4,937,657 | 6/1990 | DeBlasi et al. | 437/200 |
| 5,000,818 | 3/1991 | Thomas et al. | 437/192 |
| 5,049,975 | 9/1991 | Ajika et al. | 257/764 |
| 5,155,063 | 10/1992 | Ito | 437/192 |
| 5,162,262 | 11/1992 | Ajiko | 437/192 |
| 5,231,055 | 7/1993 | Smith | 437/192 |
| 5,242,860 | 9/1993 | Nulman et al. | 437/200 |
| 5,444,018 | 8/1995 | Yost et al. | 437/192 |
| 5,455,197 | 10/1995 | Ghanbari et al. | 437/192 |

FOREIGN PATENT DOCUMENTS

| | | |
|---|---|---|
| 0480409A1 | 4/1992 | European Pat. Off. . |
| 3743591A1 | 7/1988 | Germany . |
| 2119129 | 5/1990 | Japan . |
| 2-235372 | 9/1990 | Japan . |
| 4112529 | 4/1992 | Japan . |
| 5-13368 | 1/1993 | Japan . |
| 5036843 | 2/1993 | Japan . |
| 6-151815 | 5/1994 | Japan . |
| 6-204170 | 7/1994 | Japan . |

OTHER PUBLICATIONS

Mitsuhashi et al, "Diffusion Barrier with Reactively Sputtered TiN Film for Thermally Stable Contact in Advanced VLSI", by Katsunori Mitsuhashi, Osamu Yamazaki, Atsuhisa Inoue, Tatsu Morita., Koui Ohtake and Masayoshi Koba, Extended Abstracts of the 20th (1988 International) Conference on Solid State Devices and Materials, Tokyo, 1988, pp. 569–572.

*Primary Examiner*—John Niebling
*Assistant Examiner*—Thomas G. Bilodeau

[57] ABSTRACT

A titanium film is formed in a contact hole defined in a silicon substrate. The titanium film is transformed into a titanium silicide film and a first titanium nitride film by high-temperature lamp anneal. Further, a second titanium nitride film is stacked on the first titanium nitride film. Conditions are applied under which the titanium nitride films are formed into a granular crystal of primarily a (200) orientation. Therefore, barrier characteristics of the titanium nitride films to silicon atoms is not compromised even in the case of a subsequent high-temperature thermal treatment.

10 Claims, 4 Drawing Sheets

5,654,235

METHOD OF MANUFACTURING CONTACT STRUCTURE USING BARRIER METAL

BACKGROUND OF THE INVENTION

1. Field of the Invention

This invention relates to a contact structure suitable for use in a semiconductor device and a method of manufacturing the contact structure, and particularly to a structure for electrically connecting metal interconnects to a contact substrate using a barrier metal and a method of manufacturing the structure.

2. Description of the Related Art

Aluminum or an aluminum alloy is principally used in a contact as a material for forming a metal interconnect ohmic-connected to an impurity diffusion region formed on a silicon substrate. In this case, a single-layer interconnect composed of aluminum or the aluminum alloy reacts with silicon in a contact diffusion region by a thermal treatment to produce alloy spikes or silicon nodules that cause an increase in contact resistance. Means such as a method of interposing a barrier metal film between a metal interconnect and an impurity diffusion region, etc. are used as countermeasures against such a problem. A titanium nitride is principally used as such a barrier metal film in view of barrier characteristics. However, the conventional titanium nitride is of a single-layer film and is utilized in crystal orientation of (111). A problem arises that a titanium nitride has weak resistance to a rapid or high-temperature thermal treatment as described in Japanese Patent Application Laid-Open No. 5-13368, for example.

SUMMARY OF THE INVENTION

With the foregoing in view, it is therefore an object of the present invention to prevent a leakage current from flowing in a contact using a barrier metal.

In order to achieve the above object, there is provided a semiconductor device having a contact structure wherein a plurality of titanium nitrides used as barrier metals are stacked on one another and crystals of the titanium nitrides are formed with granular crystals as principal, and a method of manufacturing the semiconductor device.

It is another object of the present invention to provide a contact using a barrier metal resistant to a high-temperature thermal treatment.

In order to achieve the object referred to above, there is provided a semiconductor device wherein a titanium nitride used as a barrier metal is crystallized with granular crystals as principal and reliability of a contact is prevented from impairment even if a high-temperature thermal treatment is effected on the contact, and a method of manufacturing the semiconductor device.

A high degree of reliability of the semiconductor device in which the barrier metal is employed in the contact, can be realized owing to the above construction.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. In this case, elements directly associated with the present invention will be described in detail.

First and second embodiments of the present invention will be described with reference to the accompanying drawings.

The first embodiment of the present invention will first be described.

Figure 1:
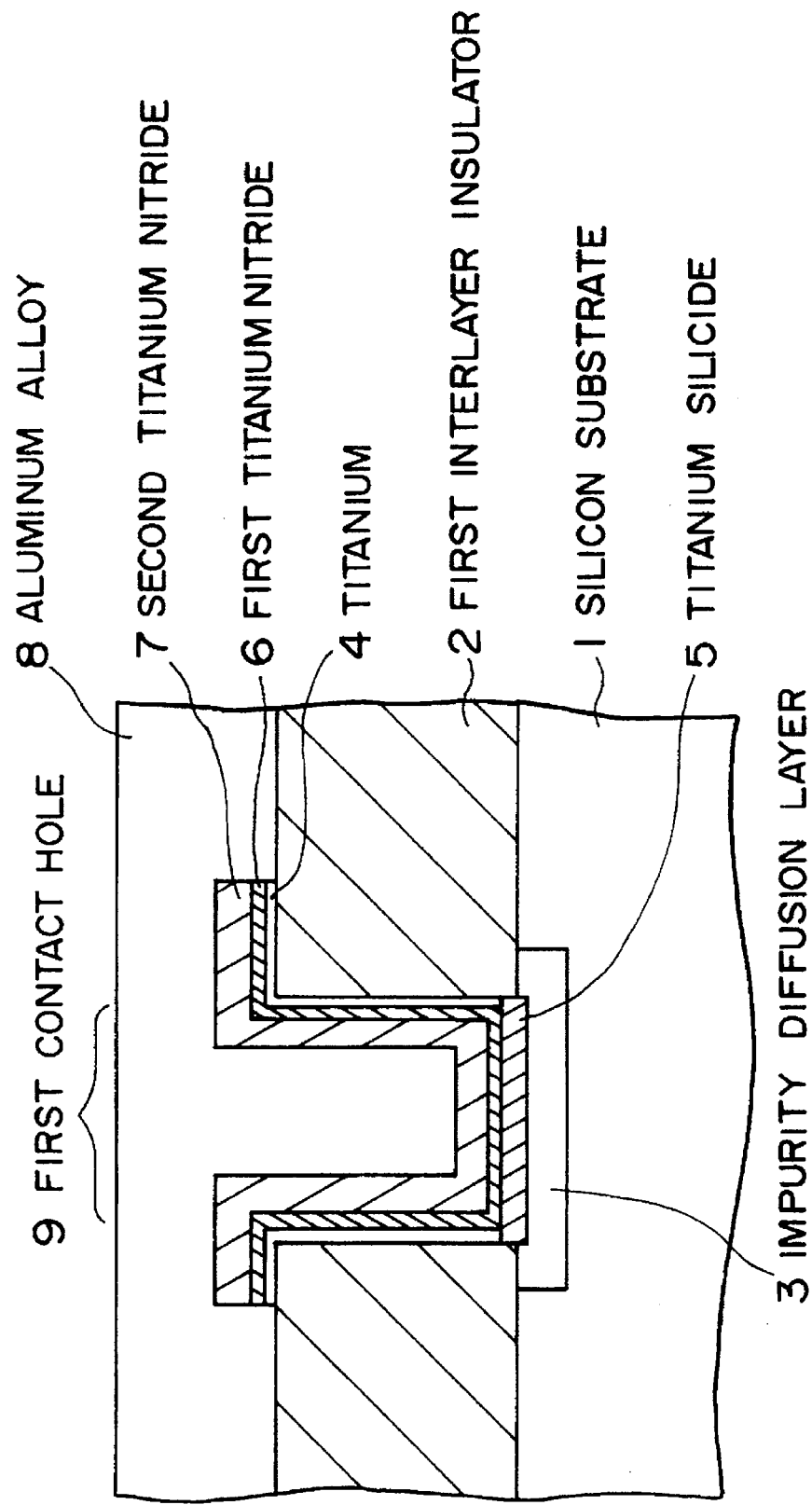
FIG. 1 is a cross-sectional view showing a contact for describing a first embodiment of the present invention.

FIG. 1 is a cross-sectional view of a contact showing the first embodiment of the present invention. In FIG. 1, a first interlayer insulating film 2 composed of a CVD oxide ($SiO_2$), a phospho-silicate glass (PSG), etc. is deposited on a silicon substrate 1. Thereafter, the first interlayer insulating film 2 is patterned to form a first contact hole 9. Next, impurity diffusion is effected on the silicon substrate 1 with the first contact hole 9 defined therein to form an impurity diffusion layer 3. Further, a titanium film 4 having a thickness of 10 nm to 30 nm is deposited on the impurity diffusion layer 3 by sputtering. Next, rapid thermal anneal such as lamp anneal is effected on the titanium film 4 in an N2 ambient at a temperature in the range of 800° C. to 900° C. to thereby transform the titanium film 4 into a titanium silicide 5 having a thickness in the range of about 16 nm to 48 nm and a first titanium nitride 6 having a thickness of about 2 nm. Further, a second titanium nitride 7 having a thickness in the range of 30 nm to 100 nm is deposited on the titanium nitride 6 by reactive sputtering. Reactive sputtering conditions include 100% N2 gas, a gas pressure of 4 mm Torr and a power of 6KW. At this time, crystal orientation of the titanium nitride formed by reactive sputtering tends to take (200) as principal (this expression is intended to mean the same as "principally" or "primarily", as explained below in connection with FIG. 6), which has been reported in the article "Diffusion Barrier with Reactively Sputtered TiN Film for Thermally Stable Contact in Advanced VLSI" published in the Extended Abstract of the 20th (1989 International) Conference on Solid State Devices and Materials, Tokyo, 1988, pp. 569–572. Crystals of (200) as principal are of granular crystals. Further, patterning is performed on the resultant product and the second titanium nitride 7, the first titanium nitride 6 and the titanium film 4 are successively etched. Thereafter, an aluminum alloy 8 having a thickness range of about 300 nm to 700 nm is deposited on the second titanium nitride 7 by sputtering.

Figure 2:
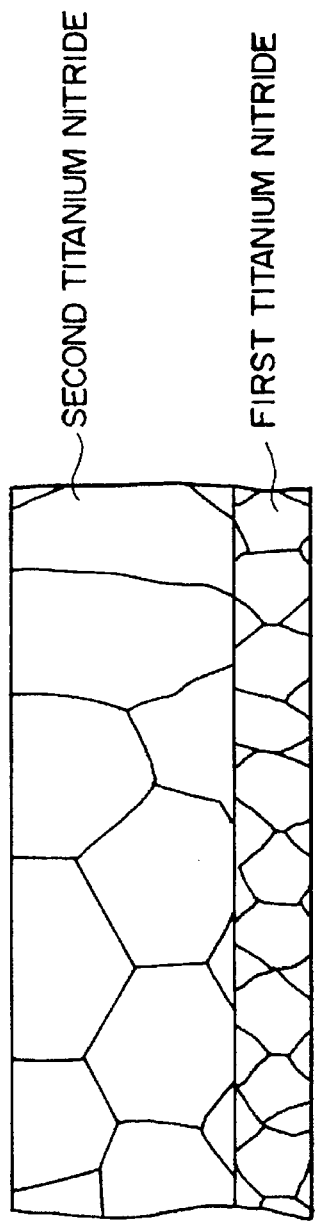
FIG. 2 is a view typically illustrating a titanium nitride oriented in the form of granular crystals.
Figure 3:
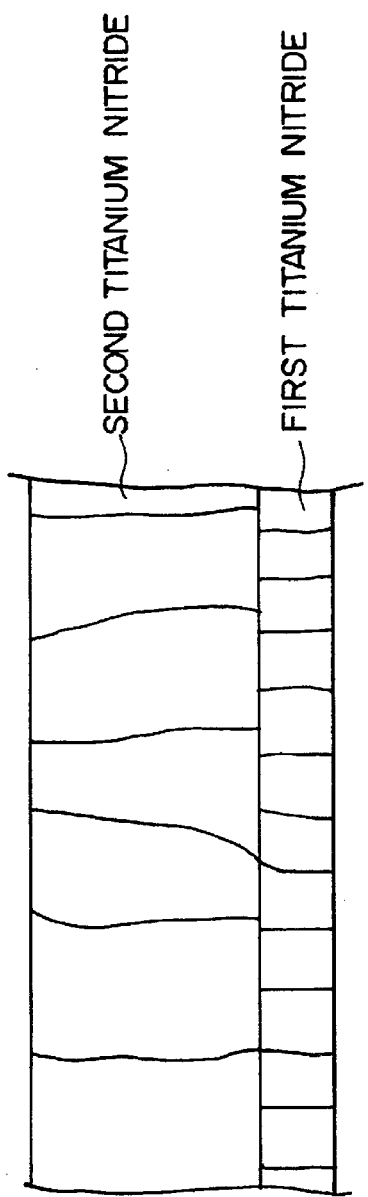
FIG. 3 is a view typically showing a titanium nitride oriented in the form of columnar crystals.

According to the present contact structure, since a plurality of titanium nitrides are stacked on one another and the titanium nitrides are oriented in the form of the granular crystals, a stable contact can be obtained which can provide a low resistance and less leakage current. This will be described later in detail in the paragraph of a second embodiment of the present invention. It is however considered that a lower titanium nitride becomes a film obtained by providing crystalline orientation for it with (200) as principal by lamp annealing using a temperature of 800° C. or over and an upper titanium nitride also becomes a film obtained by providing more crystalline orientation for it with (200) as principal according to the lower titanium nitride. The leakage current is considered to have been reduced because grain boundaries considered to be closely connected with a silicon diffusion path are not broadened orientationally but at random intervals by forming the titanium nitrides in the form of the granular crystals typified by (200) as typically shown in FIG. 2 as compared with a structure shown in FIG. 3 illustrative of a conventional columnar crystal represented by (111), and silicon diffusion paths for causing a current to flow between the upper and lower titanium nitrides are hard to connect owing to a stack structure and suppress silicon diffusion into silicon substrate, thereby enabling prevention of the leakage current.

A second embodiment of the present invention will now be described.

Figure 4:
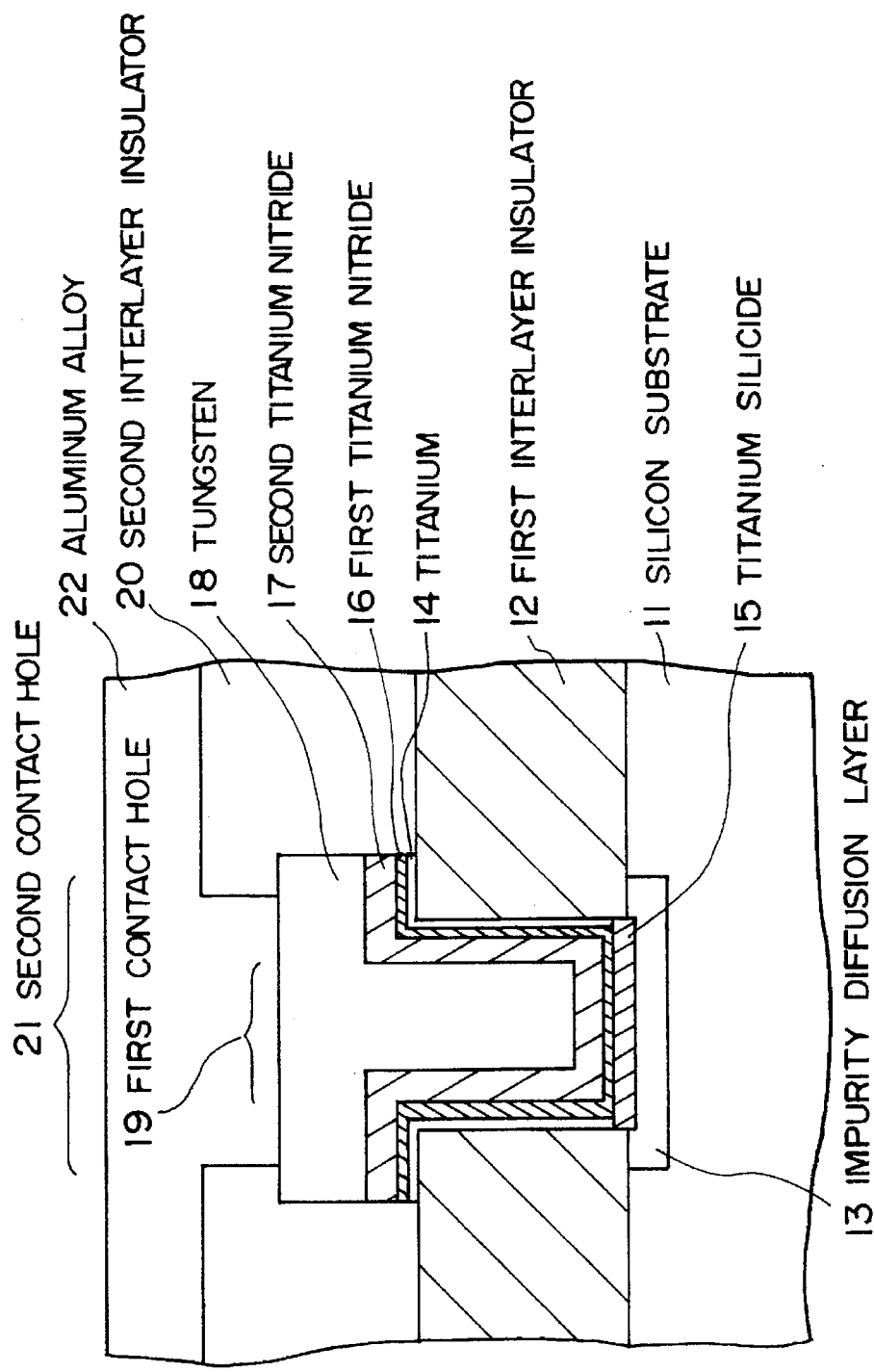
FIG. 4 is a cross-sectional view depicting a contact for describing a second embodiment of the present invention.

FIG. 4 is a cross-sectional view of a contact showing the second embodiment of the present invention. In FIG. 4, a first interlayer insulating film 12 composed of a CVD oxide, a phosopho-silicate glass, etc. is deposited on a silicon substrate 11. Thereafter, the first interlayer insulating film 12 is patterned to form a first contact hole 19. Next, impurity diffusion is effected on the silicon substrate 11 with the first contact hole 19 defined-therein to form an impurity diffusion layer 13. Further, a titanium film 14 having a thickness range of 10 nm to 30 nm is deposited on the impurity diffusion layer 13 by sputtering.

Next, lamp anneal is effected on the titanium film 14 in an N2 ambient at a temperature of 800° C. to 900° C. to thereby transform the titanium film 14 into a titanium silicide 15 having a thickness in the range of about 16 nm to 48 nm and a first titanium nitride 16 having a thickness of about 2 nm. Further, a second titanium nitride 17 having a thickness in the range of 30 nm to 100 nm is deposited on the titanium nitride 16 by reactive sputtering. Furthermore, a tungsten 18 having a thickness in the range of 200 nm to 400 nm is deposited on the second titanium nitride 17 by CVD and patterning is effected on the tungsten 18 to successively etch the tungsten 18, the second titanium nitride 17, the first titanium nitride 16 and the titanium film 14.

Next, a second interlayer insulating film 20 such as a silicon oxide film, a phosopho-silicate glass or the like, is deposited on the first interlayer insulating film 12. A glass flow is made to the second interlayer insulating film 20 at a temperature of 850° C. to 950° C., followed by patterning, thereby defining a second contact hole 21 in the second interlayer insulating film 20. Further, an aluminum alloy 22 having a thickness in the range of about 300 nm to 700 nm is deposited on the second interlayer insulating film 20 by sputtering.

Figure 5:
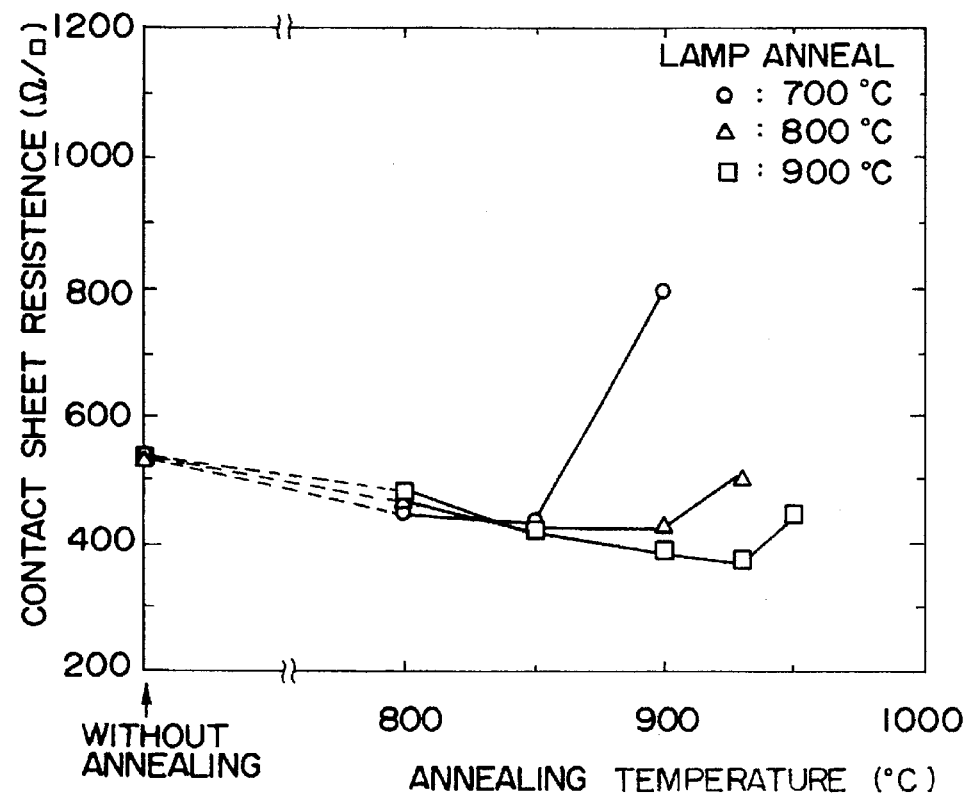
FIG. 5 is a view illustrating the dependence of a glass flow temperature on a sheet resistance of a tungsten interconnect in the contact for describing the second embodiment shown in FIG. 4.

FIG. 5 illustrates the dependence of glass flow temperature on sheet resistance of a tungsten interconnect in the contact shown in FIG. 4 for describing the second embodiment of the present invention. It is apparent from the drawing that even in the case of a high-temperature thermal treatment carried out at a temperature in the range of about 850° C. to 950° C., which could not be achieved by a conventional device or method, a substantial increase in the contact sheet resistance does not take place and barrier characteristics of the titanium nitrides are maintained.

This phenomenon has been referred to cursorily in the first embodiment but is considered to depend on the crystalline of each titanium nitride. Conventional titanium nitrides, which have been widely used at large, are of columnar crystals typically shown in FIG. 3 as mentioned above. Since the titanium nitrides are of the columnar crystals, stresses are concentrated on the titanium nitrides due to the completeness of crystalline formation at the time of the high-temperature thermal treatment and hence cracks can easily occur. Further, owing to columnar grain boundaries, atoms are brought to intergranular diffusion so as to become easy to pass through the titanium nitrides.

It is therefore considered in the conventional example that silicon atoms supplied from a silicon substrate pass through titanium nitrides and react With tungsten so as to become tungsten silicide, thereby causing an increase in the resistance of a contact.

Figure 6:
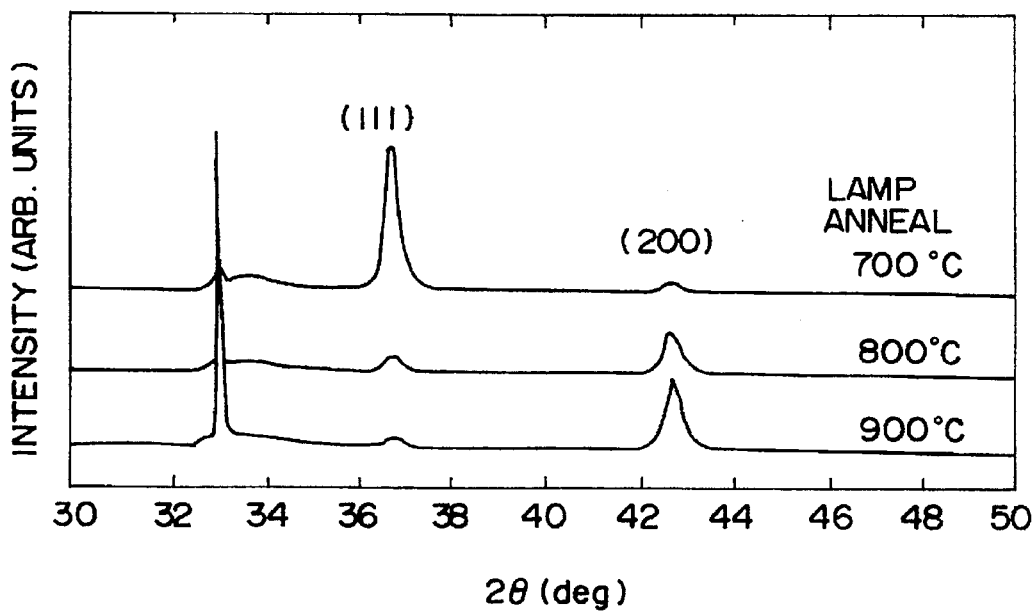
FIG. 6 is a view showing the intensity of X-ray diffraction of a thermal-treated sample employed in the second embodiment of the present invention, which is obtained by stacking first and second titanium nitrides on a titanium silicide.

FIG. 6 illustrates the intensity of X-ray diffraction of a glass-flowed sample employed in the second embodiment of the present invention, which is obtained by stacking first and second titanium nitrides on titanium silicide. As is apparent from the drawing, it can be understood that the orientation of the crystalline formation of the stacked titanium nitride is dependent upon a lamp annealing temperature of titanium for forming the first titanium nitride. In the case of lamp anneal carried out at a temperature of 700° C., the titanium nitride is crystal-oriented with (111) as principal, whereas the titanium nitride becomes a film obtained by firmly crystal-orienting the titanium nitride with (200) as principal in the case of lamp anneal carried out at a temperature of 800° C. or more. It is inferable in the present embodiment that the first titanium nitride is crystal-oriented with (200) as principal by effecting lamp anneal on the titanium film at a high temperature of 800° C. or higher, and the second titanium nitride is formed in a stack based on producing conditions under which it is considered that the first titanium nitride is easy to be crystal-oriented to the conventional (200) as a stacked crystal, thereby obtaining the crystal orientation of the titanium nitride to (200). According to the structure of the titanium nitrides crystal-oriented in granular form as in the case of (200), since the stresses are diffused upon thermal treatment even if the completeness of crystalline takes place, the cracks do not readily occur. It is believed that even if the diffusion of the grain boundaries takes place, the probability of causing the silicon atoms supplied from the silicon substrate to pass through the titanium nitrides is extremely low due to the grain boundaries defined in granular form. It is considered that owing to the above reasons, the leakage current flowing through the contact is less generated, the silicide does not react with the tungsten and the resistance of the contact is not increased.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device having an impurity diffusion layer formed on a silicon substrate and an ohmic contact including a metal interconnect, said ohmic contact being formed on the silicon substrate, said method comprising the steps of:

defining a contact hole in an interlayer insulating film provided on the impurity diffusion layer;

then forming a first titanium layer in the contact hole;

then applying a thermal treatment by lamp anneal for transforming a surface on the titanium layer into a first titanium nitride layer and for orienting the first titanium nitride layer primarily in the form of a granular crystal with a (200) orientation; and then forming a second titanium nitride layer oriented primarily in the form of a granular crystal with a (200) orientation on the first titanium nitride layer.

2. The method as claimed in claim 1, wherein the second titanium nitride layer has a thickness ranging from 30 nm to 100 nm.

3. The method as claimed in claim 1, wherein the metal interconnect is a refractory metal interconnected.

4. The method as claimed as claim 1, wherein the lamp anneal is carried out in an ambient of nitrogen or ammonia at a temperature ranging from 800° C. to 900° C.

5. A method of manufacturing a semiconductor device having an impurity diffusion layer formed on a silicon substrate and an ohmic contact including a refractory metal interconnect, said ohmic contact being formed on the silicon substrate, said method comprising the steps of:

defining a contact hole in an interlayer insulating film provided on the impurity diffusion layer;

then forming a first titanium layer in the contact hole;

then applying a first thermal treatment by lamp anneal for transforming a surface on the titanium layer into a first titanium nitride layer and for orienting the first titanium nitride layer primarily in the form of a granular crystal with a (200) orientation;

then forming a second titanium nitride layer oriented primarily in the form of a granular crystal with a (200) orientation on the first titanium nitride layer;

then forming the refractory metal interconnect on the second titanium nitride layer; and applying a second thermal treatment.

6. The method as claimed in claim 5, wherein the second titanium nitride layer has a film thickness ranging from 30 nm to 100 nm.

7. The method as claimed in claim 5, wherein the refractory metal interconnect is a tungsten interconnect.

8. The method as claimed in claim 5, wherein the lamp anneal is carried out in an ambient of nitrogen or ammonia at a temperature ranging from 800° C. to 900° C.

9. The method as claimed in claim 5, wherein the second thermal treatment is performed at a temperature ranging from 850° C. to 950° C.

10. A method of manufacturing a semiconductor device having an impurity diffusion layer formed on a silicon substrate and an ohmic contact including a metal interconnect, said ohmic contact being formed on the silicon substrate, said method comprising the steps of:

defining a contact hole in an interlayer insulating film provided on the impurity diffusion layer;

then forming a first refractory metal layer in the contact hole;

then applying a thermal treatment by lamp anneal for transforming a surface on the refractory metal layer into a first refractory metal nitride layer and orienting the first refractory metal nitride layer primarily in the form of a granular crystal; and then forming a second refractory metal nitride layer primarily in the form of a granular crystal on the first refractory metal nitride layer.

* * * * *